(12) United States Patent
Tanaka et al.

(10) Patent No.: US 7,002,334 B2
(45) Date of Patent: Feb. 21, 2006

(54) JITTER MEASURING APPARATUS AND A TESTING APPARATUS

(75) Inventors: Kouichi Tanaka, Tokyo (JP); Hirokatsu Niijima, Tokyo (JP)

(73) Assignee: Advantest Corporation, Tokyo (JP)

(*) Notice: Subject to any disclaimer, the term of this patent is extended or adjusted under 35 U.S.C. 154(b) by 0 days.

(21) Appl. No.: 11/097,102

(22) Filed: Apr. 1, 2005

(65) Prior Publication Data
US 2005/0218881 A1 Oct. 6, 2005

Related U.S. Application Data

(63) Continuation of application No. PCT/JP2003/012461, filed on Sep. 30, 2003.

(30) Foreign Application Priority Data
Oct. 1, 2002 (JP) .............................. 2002-288799

(51) Int. Cl.
*G01R 19/00* (2006.01)
*H04B 17/00* (2006.01)

(52) U.S. Cl. ..................... 324/76.11; 375/226; 375/371

(58) Field of Classification Search ..................... None
See application file for complete search history.

(56) References Cited

U.S. PATENT DOCUMENTS

| 5,452,333 | A | * | 9/1995 | Guo et al. ................... 375/371 |
| 6,661,836 | B1 | * | 12/2003 | Dalal et al. .................. 375/226 |
| 2002/0053048 | A1 | | 5/2002 | Matsumoto et al. |

OTHER PUBLICATIONS

Publication No. WO 2004/031785 with International Search Report dated Jan. 13, 2004 (2 pages).

* cited by examiner

*Primary Examiner*—Vincent Q. Nguyen
(74) *Attorney, Agent, or Firm*—Osha·Liang LLP

(57) ABSTRACT

A jitter measuring apparatus for measuring jitter of an output signal output by an electronic device is provided, wherein the jitter measuring apparatus includes a multi-strobe generating unit for generating multi-strobe having more than or equal to three (3) strobes a plurality of times synchronously with the output signal output a plurality of times by the electronic device, a value detecting unit for detecting a value of the output signal for each strobe of the multi-strobe generated a plurality of times by the multi-strobe generating unit, a transition point detecting unit for detecting the position of a transition point of the value of each output signal on the basis of the value of the output signal detected by the value detecting unit, and a histogram generating unit for counting how many times the transition point detecting unit detects the transition point at every position of the transition point of the value of the output signal.

9 Claims, 6 Drawing Sheets

JITTER MEASURING APPARATUS AND A TESTING APPARATUS

The present application is a continuation application of PCT/JP2003/012461 filed on Sep. 30, 2003, claiming priority from a Japanese patent application No. 2002-288799 filed on Oct. 1, 2002, the contents of which are incorporated herein by reference.

BACKGROUND OF THE INVENTION

1. Field of the Invention

The present invention relates to a jitter measuring apparatus for measuring jitter of a signal to be measured and a testing apparatus for testing an electronic device. In addition, the present invention relates to the following Japanese patent application. The present invention claims the benefit of, and priority to, Japanese patent application No. 2002-288799 filed on Oct. 1, 2002, the entire contents of which are incorporated herein by reference for all purposes.

2. Description of Related Art

Recently, a requirement of high operation speed and low cost of a semiconductor device is prominent. Accordingly, it is required to measure jitter of an output signal of the semiconductor device precisely. For example, in case of transferring data between semiconductor devices, it is required to measure jitter of a clock for transferring the data (DQS) precisely. In case jitter is generated in the DQS, the semiconductor device cannot transfer the data accurately.

For example, in case of storing the data in the semiconductor device according to an edge of the clock, it is required to stabilize the data given to the semiconductor device to be a desired value before the clock edge. In this case, sometimes the storage of the data cannot be correctly performed if jitter is generated in the clock. Thus, measurement of jitter of the clock and the like is conducted as a testing of the semiconductor device.

Conventionally, in case of measuring jitter of a signal to be measured, the signal to be measured is output many times, strobe signals of which phases are different little by little are generated for each signal to be measured, and the signal to be measured is scanned by the strobe signals of different phases to detect an edge of the signal to be measured. By repeating the procedures and detecting the edge of the signal to be measured many times, the jitter of the signal to be measured is measured.

However, since the conventional jitter measuring method detects the edge of the signal to be measured one time, the signal to be measured is output many times. In order to measure the jitter of the signal to be measured, it is required to detect the edge of the signal to be measured many times. Thus, the conventional measuring method takes much time for measurement. Further, since one edge is detected from signal to be measured output many times, it is impossible to measure the jitter of the signal to be measured precisely.

Accordingly, it is an object of the present invention to provide a jitter measuring apparatus and a testing apparatus, which are capable of over coming the above drawbacks accompanying the conventional art. The above object can be achieved by combinations described in the independent claims. The dependent claims define further advantageous and exemplary combinations of the present invention.

SUMMARY OF THE INVENTION

In order to solve the problems above, according to the first aspect of the present invention, a jitter measuring apparatus for measuring jitter of an output signal output by an electronic device is provided, wherein the jitter measuring apparatus includes a multi-strobe generating unit for generating multi-strobe having more than or equal to three (3) strobes a plurality of times synchronously with the output signal output a plurality of times by the electronic device, a value detecting unit for detecting a value of the output signal for each strobe of the multi-strobe generated a plurality of times by the multi-strobe generating unit, a transition point detecting unit for detecting the position of a transition point of the value of each output signal on the basis of the value of the output signal detected by the value detecting unit, and a histogram generating unit for counting how many times the transition point detecting unit detects the transition point at every position of the transition point of the value of the output signal.

The jitter measuring apparatus may further include a jitter acquiring unit for acquiring jitter of the output signal on the basis of the count result of the histogram generating unit. Further, the histogram generating unit may include a counter for counting at which strobe of the multi-strobe the transition point of the value of the output signal is detected for each strobe on the basis of the detection result of the transition point detecting unit. The histogram generating unit may include a transition point storage memory for storing the detection result of the transition point detecting unit.

The multi-strobe generating unit may include a plurality of serially-connected variable delay circuits for receiving strobe timing signals, delaying the received strobe timing signals by a predetermined time, and outputting each of them sequentially as the strobe, the value detecting unit may include a plurality of timing comparing devices each of which is provided to correspond to one of the variable delay circuits and detects the value of the output signal by the strobe output by the corresponding variable delay circuit, and the transition point detecting unit may detect the position of the transition point of the value of each output signal on the basis of the detection result of the plurality of timing comparing devices.

The jitter measuring apparatus may further include a first comparator for comparing the value of the output signal with a first threshold value showing a H-level and outputting the comparison result as a H-level comparison result, and a second comparator for comparing the value of the output signal with a second threshold value showing an L-level and outputting the comparison result as an L-level comparison result, the multi-strobe generating unit may generate a first multi-strobe based on a timing of a rising edge of the output signal and a second multi-strobe based on a timing of a falling edge of the output signal, the value detecting unit may detect a value of the H-level comparison result by the first multi-strobe and a value of the L-level comparison result by the second multi-strobe, and the transition point detecting unit may detect a transition point of the value of the H-level comparison result as a transition point of a value of the rising edge of the output signal and a transition point of the value of the L-level comparison result as a transition point of a value of the falling edge of the output signal.

The multi-strobe generating unit may include a plurality of serially-connected first variable delay circuits for receiving a first strobe timing signal and outputting the first multi-strobe and a plurality of serially-connected second variable delay circuits for receiving a second strobe timing signal and outputting the second multi-strobe, and the value detecting unit may include a plurality of first timing comparing devices for detecting the value of the H-level comparison result by the first multi-strobe and a plurality of second timing comparing devices for detecting the value of the L-level comparison result by the second multi-strobe.

The jitter measuring apparatus may further include a selecting device for selecting one of the transition points of the values of the rising edge and the falling edge of the output signal detected by the transition point detecting unit and providing the histogram generating unit with it.

According to the second aspect of the present invention, a testing apparatus for testing an electronic device is provided, wherein the testing apparatus includes a pattern generating unit for generating a test pattern for testing the electronic device; a pattern formatting unit for formatting the test pattern and providing the electronic device with it; a jitter measuring apparatus for analyzing jitter of an output signal output by the electronic device according to the test pattern; and a determining device for determining pass/fail of the electronic device on the basis of the analysis result of the jitter measuring apparatus, and the jitter measuring apparatus includes a multi-strobe generating unit for generating multi-strobe having more than or equal to three (3) strobes a plurality of times synchronously with the output signal output a plurality of times by the electronic device, a value detecting unit for detecting a value of the output signal for each strobe of the multi-strobe generated a plurality of times by the multi-strobe generating unit, a transition point detecting unit for detecting the position of a transition point of the value of each output signal on the basis of the value of the output signal detected by the value detecting unit, and a histogram generating unit for counting how many times the transition point detecting unit detects the transition point at every position of the transition point of the value of the output signal.

The summary of the invention does not necessarily describe all necessary features of the present invention. The present invention may also be a sub-combination of the features described above.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
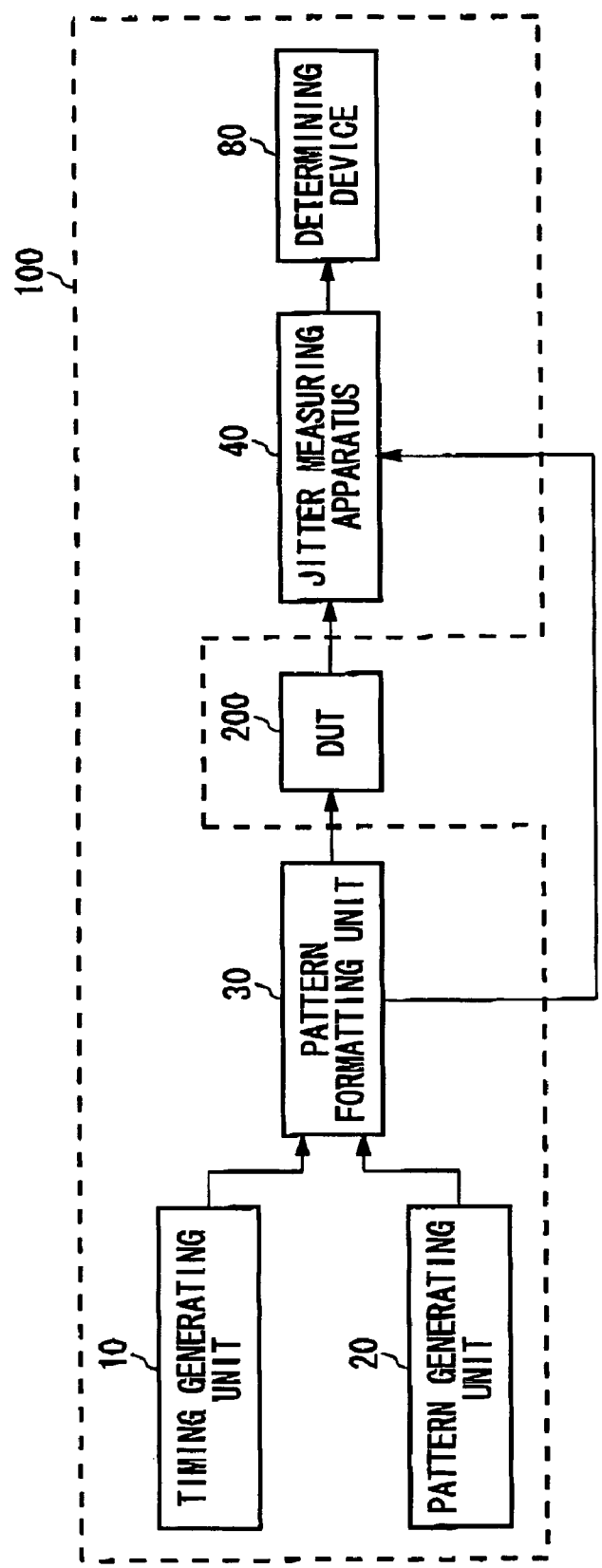
FIG. 1 shows an example of the configuration of a testing apparatus 100 according to an embodiment the present invention.

FIG. 1 shows an example of the configuration of a testing apparatus 100 according to an embodiment the present invention. The testing apparatus 100 measures jitter of an electronic device 200 which is a device under test. The testing apparatus 100 includes a timing generating unit 10, a pattern generating unit 20, a pattern formatting unit 30, a jitter measuring apparatus 40, and a determining device 80.

The timing generating unit 10 generates a timing signal for operating the testing apparatus 100. For example, the timing generating unit 10 provides the pattern formatting unit 30 with a signal showing a timing of providing the electronic device 200 with a test pattern. Further, the timing generating unit 10 may generate a reference clock for synchronizing operation of the testing apparatus 100 and provide each of elements of the testing apparatus 100 with the reference clock.

The pattern generating unit 20 generates a test pattern for testing the electronic device 200 and provides the pattern formatting unit 30 with the test pattern. The pattern formatting unit 30 formats the test pattern and provides the electronic device 200 with the test pattern according to the signal received from the timing generating unit 10.

The jitter measuring apparatus 40 analyzes an output signal output by the electronic device 200 according to the test pattern. The determining device 80 determines pass/fail of the electronic device 200 on the basis of the analysis result of the jitter measuring apparatus 40.

Figure 2:
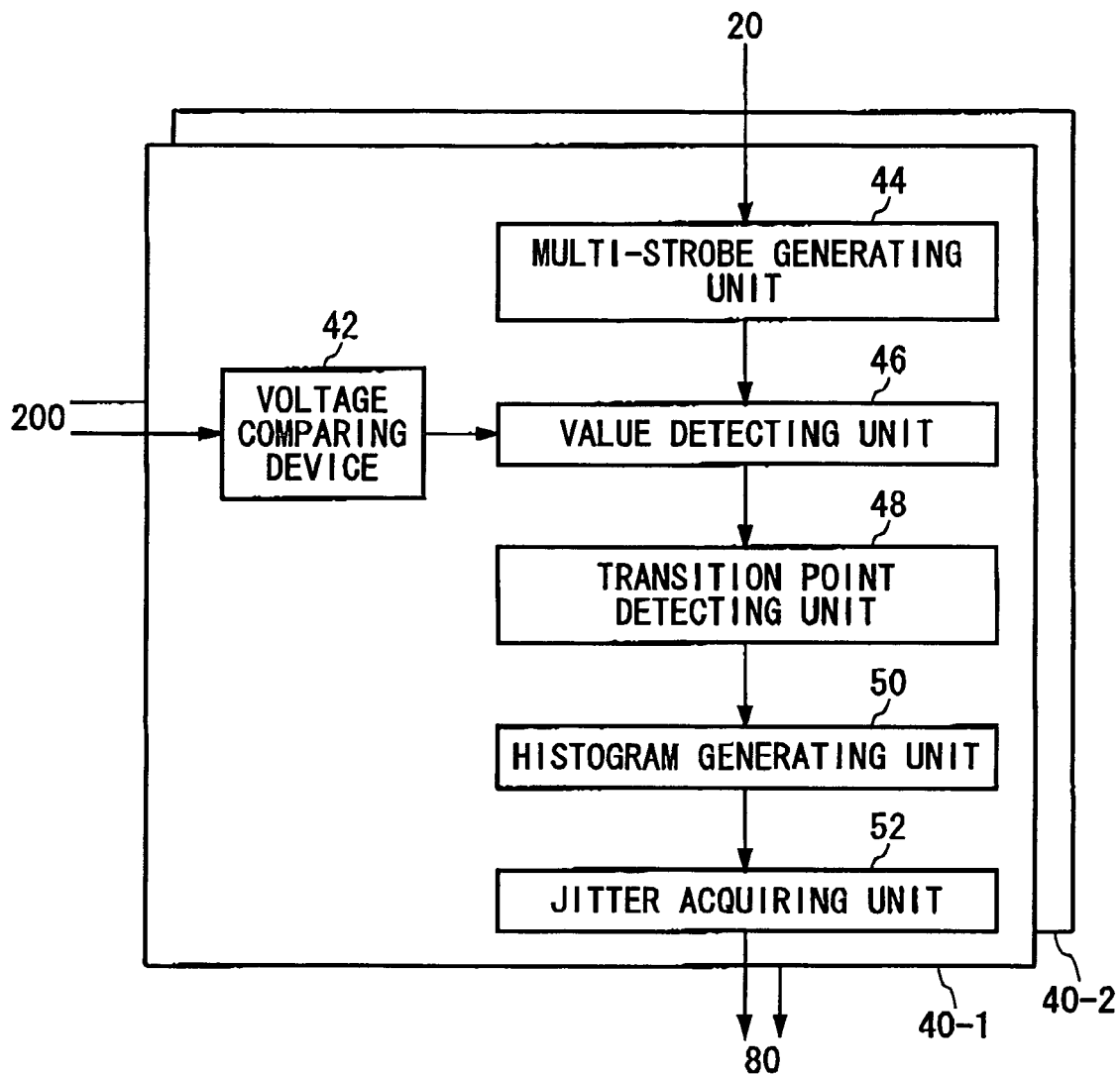
FIG. 2 shows an example of the configuration of a jitter measuring apparatus 40.

FIG. 2 shows an example of the configuration of the jitter measuring apparatus 40. The jitter measuring apparatus 40 detects a transition point of a signal to be measured and measures jitter by multi-strobe having more than or equal to three (3) strobes. For example, the jitter measuring apparatus 40 measures jitter of the output signal on the basis of the output signals output many times by the electronic device 200.

Further, the testing apparatus 100 according to the present example includes a jitter measuring apparatus 40-1 for measuring jitter of a data signal (DQ) out of the output signal of the electronic device 200 and a jitter measuring apparatus 40-1 for measuring jitter of a clock signal (DQS) output synchronously with the data signal. Each of the jitter measuring apparatus 40 includes a voltage comparing device 42, a multi-strobe generating unit 44, a value detecting unit 46, a transition point detecting unit 48, a histogram generating unit 50, and a jitter acquiring unit 52. Although the jitter measuring apparatus 40-1 for measuring jitter of the clock signal in the present is explained, the jitter measuring apparatus 40-2 has the same function and configuration as those of the jitter measuring apparatus 40-1.

The voltage comparing device 42 compares the clock signal output by the electronic device 200 with a predetermined threshold value and provides the value detecting unit 46 with the comparison result. For example, the voltage comparing device 42 determines whether the clock signal shows a value of H-level or L-level by comparing the clock signal with a predetermined threshold value.

The multi-strobe generating unit 44 generates multi-strobe having more than or equal to three (3) strobes many times to be synchronized with the clock signals output many times by the electronic device 200. Here, the multi-strobe is a set of a plurality of strobes each of which phase is different from each other little by little. The value detecting unit 46 detects a value of a clock signal of each of the strobes of each multi-strobe generated by the multi-strobe generating unit 44.

The transition point detecting unit 48 detects the position of a transition point of the value of each of the clock signals output many times by the electronic device 200 on the basis of the value of the clock signal detected by the value detecting unit 46. The histogram generating unit 50 counts how many times the transition point is detected at every position of the transition point of the value of each clock signal detected by the transition point detecting unit 48. Thus, the histogram generating unit 50 generates a histogram of the transition point of the value of each clock signal detected by the transition point detecting unit 48. It is possible to perform various analysis of the clock signal by the histogram generated by the histogram generating unit 50.

The jitter acquiring unit 52 acquires jitter of the clock signal on the basis of the count result of the histogram generating unit 50. In other words, the jitter acquiring unit 52 acquires the jitter of the clock signal on the basis of the histogram generated by the histogram generating unit 50. Further, the jitter acquiring unit 52 provides the determining device 80 with the acquired jitter of the clock signal. Similarly, a jitter acquiring unit 52 of the jitter measuring device 40-2 provides the determining device 80 with the acquired jitter of the data signal. The determining device 80 determines pass/fail of the electronic device 200 on the basis of the jitter of the clock signal and the data signal.

Figure 3:
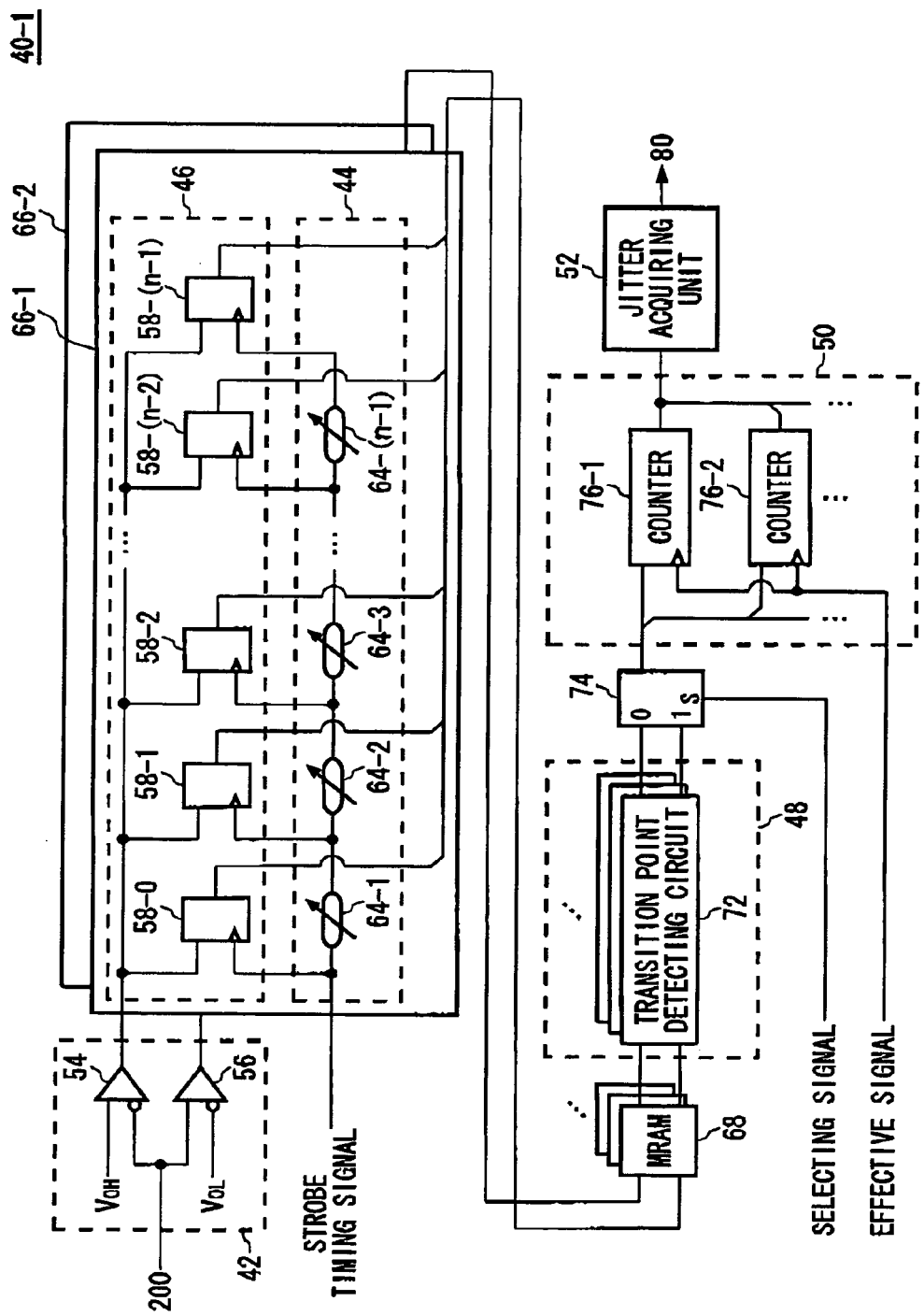
FIG. 3 shows an example of the configuration of a jitter measuring apparatus 40-1 in detail.

FIG. 3 shows an example of the configuration of the jitter measuring apparatus 40-1 in detail. According to the present example, the jitter measuring apparatus 40-1 includes a first logic comparing device 66-1 and a second logic comparing device 66-2 each of which includes the strobe generating unit 44 and the value detecting unit 46. Further, the jitter measuring apparatus 40-1 further includes a temporary memory 68 and a selecting device 74 in addition to the configuration described with respect to FIG. 2.

The voltage comparing device 42 includes a first comparator 54 for comparing the value of the clock signal output by the electronic device 200 with a first threshold value $V_{OH}$ showing the H-level and outputting the comparison result as a H-level comparison result and a second comparator 56 for comparing the value of the clock signal with a second threshold value $V_{OL}$ showing the L-level and outputting the comparison result as a L-level comparison result. The first comparator 54 provides the first logic comparing device 66-1 with the H-level comparison result and the second comparator 56 provides the second logic comparing device 66-2 with the L-level comparison result.

The multi-strobe generating unit 46 of each of the first and second logic comparing devices 66-1 and 66-2 generates a first multi-strobe based on a timing of a rising edge of the clock signal and a second multi-strobe based on a timing of a falling edge of the clock signal. The value detecting unit 46 of each of the first and second logic comparing devices 66-1 and 66-2 detects a value of the H-level comparison result by the first multi-strobe and the L-level comparison result by the second multi-strobe.

For example, the multi-strobe generating unit 44 of the first logic comparing device 66-1 includes a plurality of serially-connected first variable delay circuits 64 for receiving a first strobe timing signal and outputting the first multi-strobe. The multi-strobe generating unit 44 of the second logic comparing device 66-2 includes a plurality of serially-connected second variable delay circuits (not shown) for receiving a second strobe timing signal and outputting the second multi-strobe. Each of the strobe generating units 44 according to the present example includes n−1 variable delay circuits (here, n is an integer equal to or more than or equal to three (3)) and generates multi-strobe having n strobes from the given strobe timing signal and the strobe output by each of the variable delay circuits.

Further, the value detecting unit 46 of the first logic comparing device 66-1 includes a plurality of first timing comparing devices 58 for detecting a value of the H-level comparison result by the first multi-strobe and the value detecting unit 46 of the second logic comparing device 66-2 includes a plurality of second timing comparing devices (not shown) for detecting a value of the L-level comparison result by the second multi-strobe. Although the configuration and operation of the first logic comparing device 66-1 are described in the following, the second logic comparing device 66-2 has the same configuration and operation.

The plurality of variable delay circuits 64 receives the strobe timing signals, delays the received strobe timing signals by a predetermined time, and outputs sequentially each of them as a strobe. Each of the variable delay circuits 64 delays the strobe timing signals sequentially by a delay amount corresponding to a strobe interval of the multi-strobe to be generated and outputs them. Here, the strobe timing signal is given at a desired timing of generating the multi-strobe synchronously with the clock signals output many times by the electronic device 200. The strobe timing signal may be generated, for example, by the timing generating unit 10.

Each of the plurality of timing comparing devices 58 is provided to correspond to one of the variable delay circuits 64 and detects the value of the H-level comparison result of the clock signal by the strobe output by the corresponding variable delay circuit 64. In other words, each of the timing comparing devices 58 detects the H-level comparison result at the timing of receiving the strobe output by the corresponding variable delay circuit 64, According to the present example, the timing comparing device 58-0 detects a value of the H-level comparison result of the clock signal by the strobe timing signal.

The value detected by each of the timing comparing devices 58 is stored in the temporary memory 68 as a digital signal of n-bits. According to the present example, the multi-strobe generating apparatus 40-1 includes n temporary memories 68 and each of the temporary memories 68 stores each bit of the detected values of the H-level comparison result and the L-level comparison result.

The transition point detecting unit 48 detects the position of the transition point of the value of the each clock signal on the basis of the detection results of the plurality of timing comparing devices 58. The transition point detecting unit 48 according to the present example detects a transition point of the value of the H-level comparison result as a transition point of a value of the rising edge of the clock signal and a transition point of the value of the L-level comparison result as a transition point of a value of the falling edge of the clock signal.

The transition point detecting unit 48 includes n-1 transition point detecting circuits 72, and each of the transition point detecting circuits 72 detects a transition point of the value of the H-level comparison result by comparing the values of adjacent bits of a digital signal of the value of the H-level comparison result stored by the temporary memory 68. Further, a transition point of the value of the L-level comparison result is detected in the same way.

The selecting device 74 selects one of the transition points of the values of the rising and falling edges of the clock signal detected by the transition point detecting unit 48 and provides the histogram generating unit 50 with it. The selecting device 74 is provided with a selecting signal and selects the transition point of the value of the rising or falling edge of the clock signal on the basis of the selecting signal. The selecting signal may be generated by the pattern generating unit 20.

The histogram generating unit 50 includes a plurality of counters 76 for counting at which strobe of the multi-strobe a transition point of the value of the clock signal is detected for every strobe on the basis of the detection result of the transition point detecting unit 48 selected by the selecting device 74. Each of the counters 76 is provided with an effective signal for instructing to conduct counting. The effective signal may be generated by the pattern generating unit 20. In this case, the pattern generating unit 20 provides each counter 76 with the effective signal for making the counter 76 count at every time the multi-strobe generating apparatus 40 generates the multi-strobe. The histogram generating unit 50 generates a histogram of the transition point of the value of the clock signal according to the counting result of each counter 76.

The jitter acquiring unit 52 measures jitter of the clock signal on the basis of the histogram generated by the histogram generating unit 50. For example, the jitter acquiring unit 52 measures the jitter of the clock signal on the basis of the timing of the strobe at which the counting result of the corresponding counter 76 is larger than a predetermined threshold value.

As described above, according to the jitter measuring apparatus of the present example, it is not required to measure a clock signal many times in order to detect one transition point because a transition point of the value of each clock signal is detected by multi-strobe. Thus, it is possible to reduce dramatically the time taken to measure jitter. Further, since one transition point is detected from one clock signal, it is possible to detect the transition point accurately. Thus, it is possible to measure jitter of the signal to be measured accurately. Further, the testing apparatus 100 can determine pass/fail of the electronic device 200 accurately.

Figure 4:
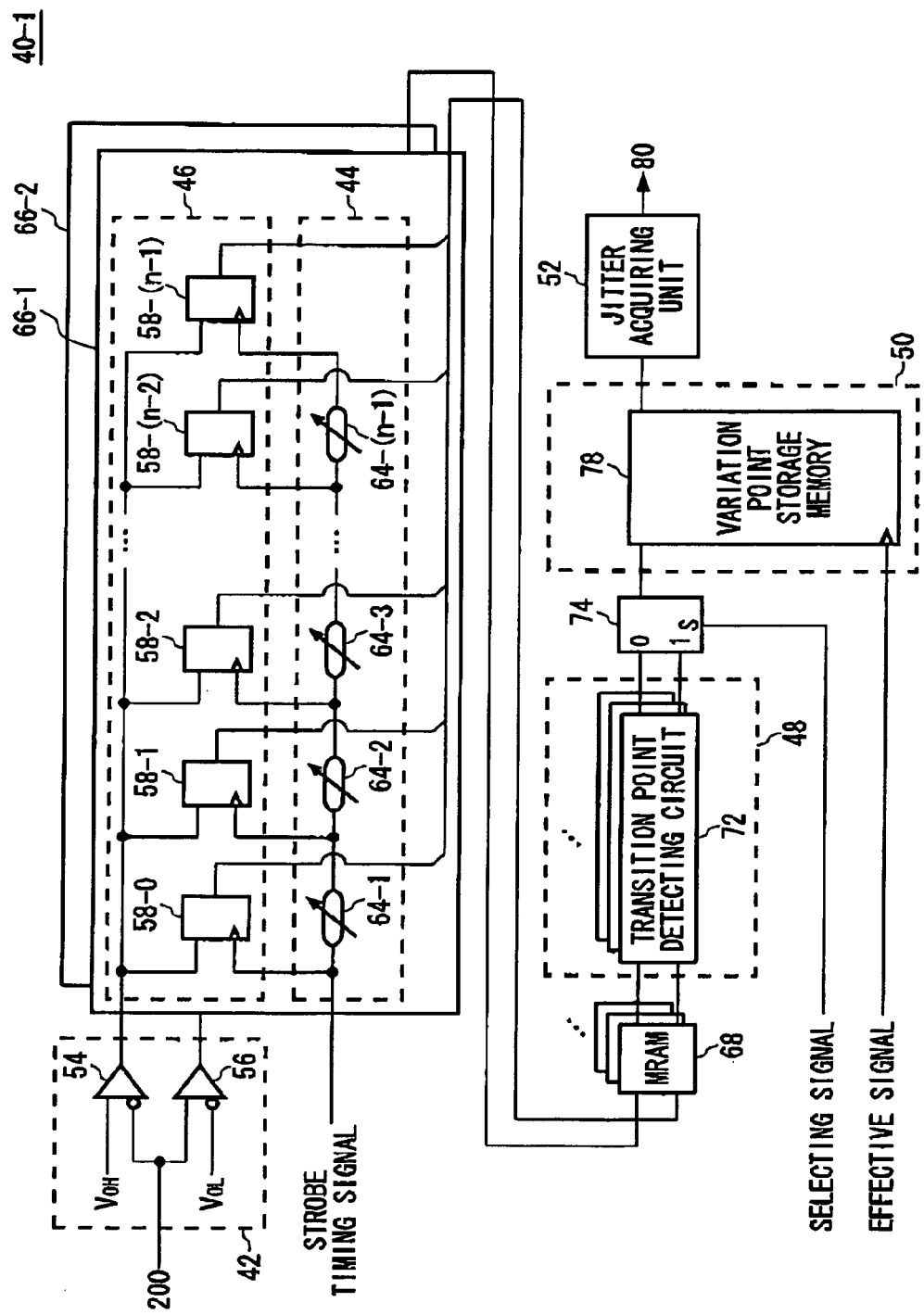
FIG. 4 shows another example of the configuration of a jitter measuring apparatus 40-1 in detail.

FIG. 4 shows another example of the configuration of the jitter measuring apparatus 40-1 in detail. The jitter measuring apparatus 40-1 according to the present example is different from the measuring apparatus 40-1 described with respect to FIG. 3 in the configuration of the histogram generating unit 50. Other elements are the same as those of the measuring apparatus 40-1 described with respect to FIG. 3 in terms of function and configuration.

The histogram generating unit 50 according to the present example includes a transition point storage memory 78 for storing the detection result of the transition point detecting unit 48 selected by the selecting device 74. The transition point storage memory 78 is provided with an effective signal for instructing to store the detection result. The histogram generating unit 50 may further include a means for generating a histogram of the transition point of the value of the clock signal on the basis of the detection result stored by the transition point storage memory 78. The jitter acquiring unit 52 acquires jitter of the clock signal on the basis of the histogram.

Figure 5:
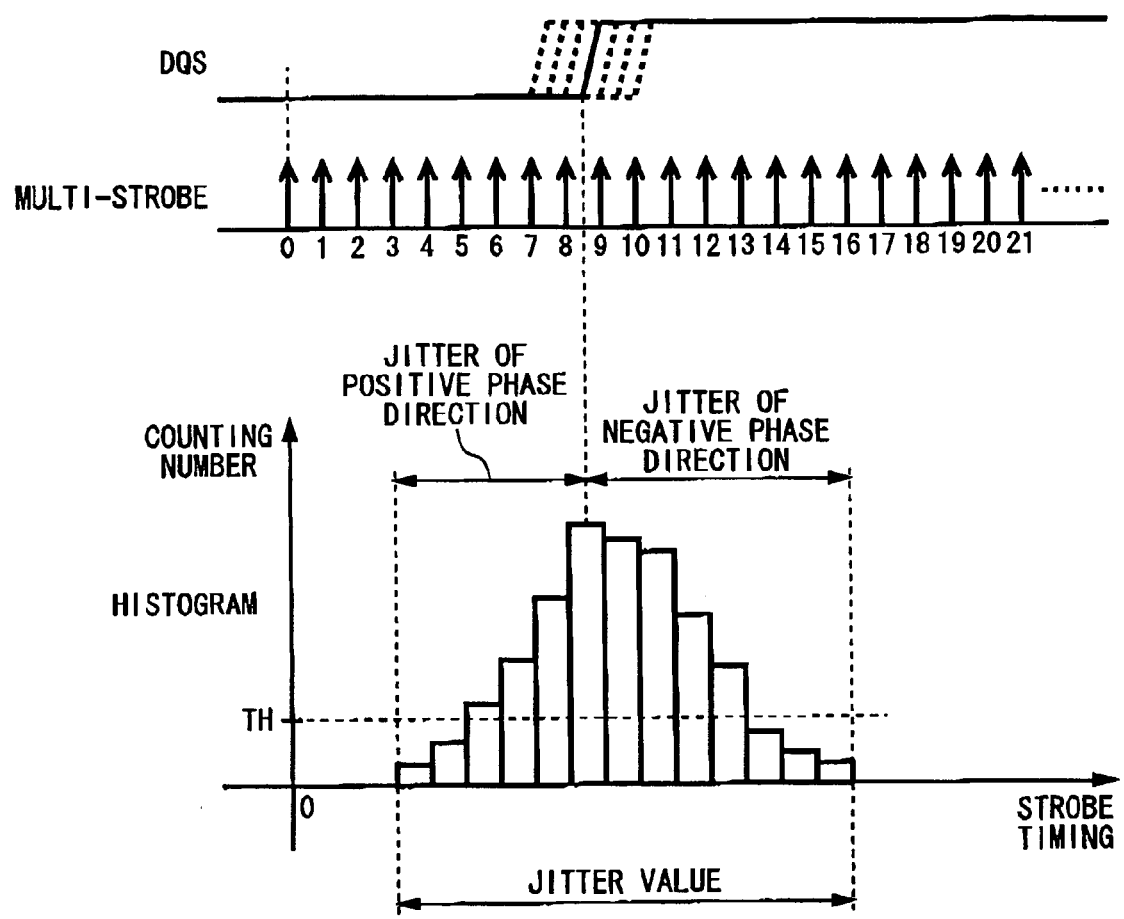
FIG. 5 shows an example of a histogram generated by a histogram generating unit 50.

FIG. 5 shows an example of a histogram generated by the histogram generating unit 50. As shown in FIG. 5, the histogram generating unit 50 generates a histogram for showing a result of counting at which strobe of each multi-strobe a transition point of the clock signal is detected.

The jitter acquiring unit 52 acquires jitter of the clock signal on the basis of the histogram generated by the histogram generating unit 50. For example, the jitter of the clock signal may be acquired on the basis of the timing of the strobe of detecting the transition point. Further, as shown in FIG. 5, the jitter of the clock signal may be acquired on the basis of the timing of the strobe where the number of times the transition point is detected is more than a threshold value TH.

Further, the jitter acquiring unit 52 may analyze a distribution of jitter of the clock signal on the basis of the histogram. Further, jitter of the positive phase direction and jitter of the negative phase direction may be measured on the basis of an ideal position of the edge of the clock signal.

Figure 6:
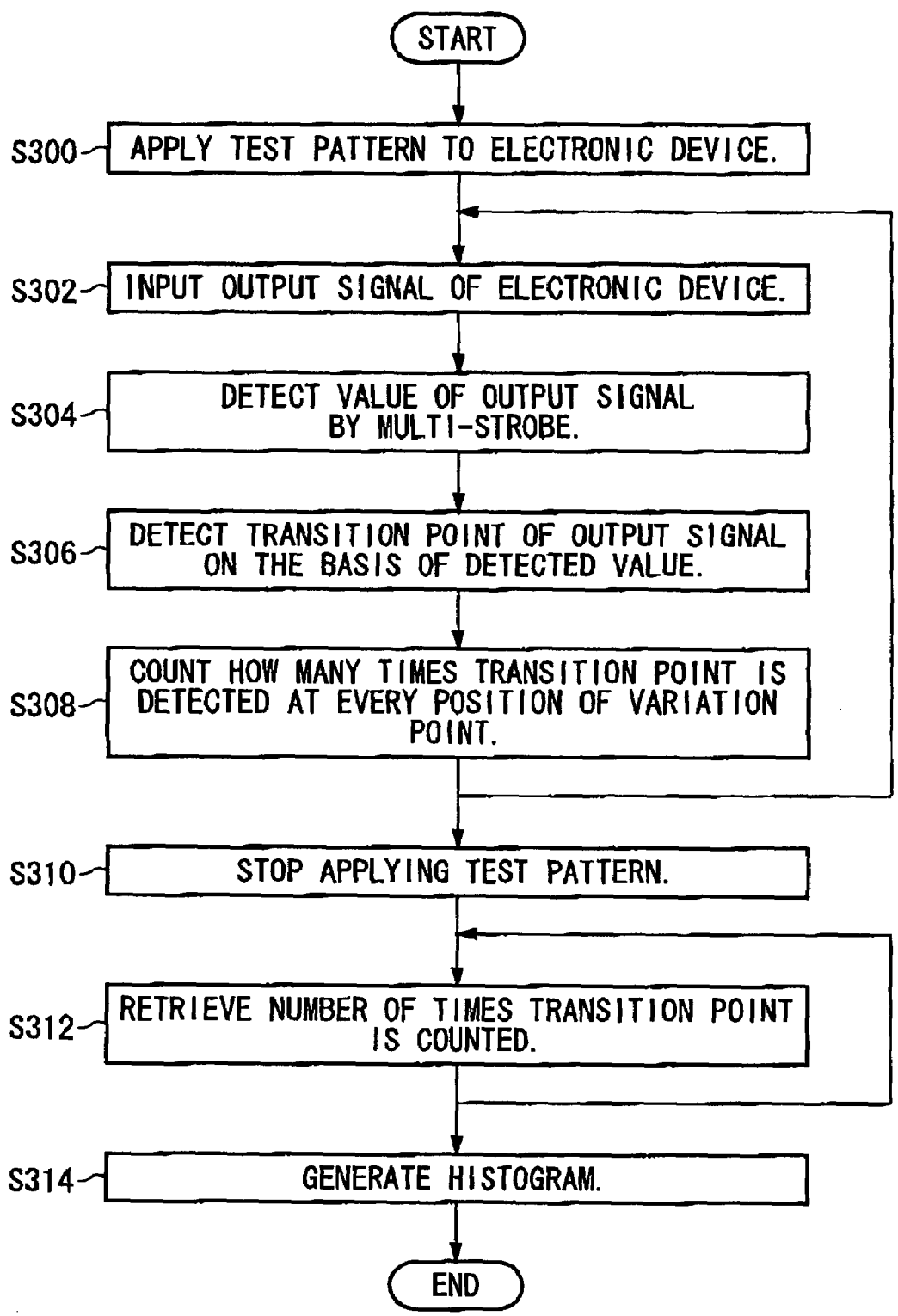
FIG. 6 is a flowchart showing an example of operation of the jitter measuring apparatus 40.

FIG. 6 is a flowchart showing an example of operation of the jitter measuring apparatus 40. In case of measuring jitter of an output signal output by the electronic device 200, first, the testing apparatus 100 applies a test pattern to the electronic device 200 (S300). Then, an output signal output by the electronic device 200 according to the test pattern is input to the jitter measuring apparatus 40 (S302).

Then, the value detecting unit 46 detects a value of the output signal by the multi-strobe (S304). Then, the transition point detecting unit 48 detects a transition point of the value of the output signal on the basis of the value of the output signal detected by the value detecting unit 46 (S306). Then, the counter 76 of the histogram generating unit 50 counts how many times the transition point is detected for every transition point of the value of the output signal (S308). Here, the processes of S302 to S308 are repeated a predetermined number of times and the transition point of the value of the output signal a plurality of times.

Then, it is stopped to provide the electronic device 200 with the test pattern (S310) and the number of times the transition point is counted by each counter 76 is retrieved (S312). Here, S312 is repeated until all the counters 76 retrieve the number of times the transition point is counted. Then, on the basis of the retrieved number of times the transition point is counted, a histogram of the position of the transition point of the value of the output signal is generated (S314). The testing apparatus 100 analyzes the jitter of the output signal on the basis of the histogram generated in S314.

Although the present example describes an example of the operation of the jitter measuring apparatus 40 described with respect to FIG. 3, the jitter measuring apparatus 40 described with respect to FIG. 4 performs the same operation.

As obvious from the above description, according to the jitter measuring apparatus of the present invention, it is possible to detect jitter of a signal to be measured at a high speed and accurately. Further, according to the testing apparatus, it is possible to test an electronic device accurately.

Although the present invention has been described by way of exemplary embodiments, it should be understood that those skilled in the art might make many changes and substitutions without departing from the spirit and the scope of the present invention, which is defined only by the appended claims.

What is claimed is:

1. A jitter measuring apparatus for measuring jitter of an output signal output by an electronic device comprising:

a multi-strobe generating unit for generating multi-strobe having more than or equal to three (3) strobes a plurality of times synchronously with the output signal output a plurality of times by the electronic device, a value detecting unit for detecting a value of the output signal for each strobe of the multi-strobe generated a plurality of times by said multi-strobe generating unit, a transition point detecting unit for detecting the position of a transition point of the value of each output signal on the basis of the value of the output signal detected by said value detecting unit, and a histogram generating unit for counting how many times said transition point detecting unit detects the transition point at every position of the transition point of the value of the output signal.

2. A jitter measuring apparatus as claimed in claim 1 further comprising a jitter acquiring unit for acquiring jitter of the output signal on the basis of the count result of said histogram generating unit.

3. A jitter measuring apparatus as claimed in claim 2, wherein said histogram generating unit comprises a counter for counting at which strobe of the multi-strobe the transition point of the value of the output signal is detected for each strobe on the basis of the detection result of said transition point detecting unit.

4. A jitter measuring apparatus as claimed in claim 2, wherein said histogram generating unit comprises a transition point storage memory for storing the detection result of said transition point detecting unit.

5. A jitter measuring apparatus as claimed in claim 1, wherein
said multi-strobe generating unit includes a plurality of serially-connected variable delay circuits for receiving strobe timing signals, delaying the received strobe timing signals by a predetermined time, and outputting each of them sequentially as the strobe,
said value detecting unit includes a plurality of timing comparing devices each of which is provided to correspond to one of said variable delay circuits and detects the value of the output signal by the strobe output by said corresponding variable delay circuit, and
said transition point detecting unit detects the position of the transition point of the value of each output signal on the basis of the detection result of said plurality of timing comparing devices.

6. A jitter measuring apparatus as claimed in claim 5 further comprising
a first comparator for comparing the value of the output signal with a first threshold value showing a H-level and outputting the comparison result as a H-level comparison result, and
a second comparator for comparing the value of the output signal with a second threshold value showing an L-level and outputting the comparison result as an L-level comparison result, wherein
said multi-strobe generating unit generates a first multi-strobe based on a timing of a rising edge of the output signal and a second multi-strobe based on a timing of a falling edge of the output signal,
said value detecting unit detects a value of the H-level comparison result by the first multi-strobe and a value of the L-level comparison result by the second multi-strobe, and
said transition point detecting unit detects a transition point of the value of the H-level comparison result as a transition point of a value of the rising edge of the output signal and a transition point of the value of the L-level comparison result as a transition point of a value of the falling edge of the output signal.

7. A jitter measuring apparatus as claimed in claim 6, wherein
said multi-strobe generating unit includes a plurality of serially-connected first variable delay circuits for receiving a first strobe timing signal and outputting the first multi-strobe and a plurality of serially-connected second variable delay circuits for receiving a second strobe timing signal and outputting the second multi-strobe, and
said value detecting unit includes a plurality of first timing comparing devices for detecting the value of the H-level comparison result by the first multi-strobe and a plurality of second timing comparing devices for detecting the value of the L-level comparison result by the second multi-strobe.

8. A jitter measuring apparatus as claimed in claim 7 further comprising a selecting device for selecting one of the transition points of the values of the rising edge and the falling edge of the output signal detected by said transition point detecting unit and providing said histogram generating unit with it.

9. A testing apparatus for testing an electronic device comprising:
a pattern generating unit for generating a test pattern for testing the electronic device;
a pattern formatting unit for formatting the test pattern and providing the electronic device with it;
a jitter measuring apparatus for analyzing jitter of an output signal output by the electronic device according to the test pattern; and
a determining device for determining pass/fail of the electronic device on the basis of the analysis result of the jitter measuring apparatus, wherein
said jitter measuring apparatus comprises
a multi-strobe generating unit for generating multi-strobe having more than or equal to three (3) strobes a plurality of times synchronously with the output signal output a plurality of times by the electronic device,
a value detecting unit for detecting a value of the output signal for each strobe of the multi-strobe generated a plurality of times by said multi-strobe generating unit,
a transition point detecting unit for detecting the position of a transition point of the value of each output signal on the basis of the value of the output signal detected by said value detecting unit, and
a histogram generating unit for counting how many times said transition point detecting unit detects the transition point at every position of the transition point of the value of the output signal.

* * * * *